(12) United States Patent
Majima (10) Patent No.: US 8,498,355 B2
(45) Date of Patent: *Jul. 30, 2013

(54) DEVICE AND METHOD FOR CORRECTING A DATA ERROR IN COMMUNICATION PATH

(75) Inventor: Taichi Majima, Yokohama (JP)

(73) Assignee: Kabushiki Kaisha Kenwood, Hachiouji-shi, Tokyo (JP)

( * ) Notice: Subject to any disclaimer, the term of this patent is extended or adjusted under 35 U.S.C. 154(b) by 727 days.

This patent is subject to a terminal disclaimer.

(21) Appl. No.: 10/581,667

(22) PCT Filed: Dec. 7, 2004

(86) PCT No.: PCT/JP2004/018536
§ 371 (c)(1),
(2), (4) Date: Jun. 5, 2006

(87) PCT Pub. No.: WO2005/055542
PCT Pub. Date: Jun. 16, 2005

(65) Prior Publication Data
US 2007/0136637 A1 Jun. 14, 2007

(30) Foreign Application Priority Data
Dec. 8, 2003 (JP) ................................. 2003-409688

(51) Int. Cl.
*H04L 5/12* (2006.01)

(52) U.S. Cl.
USPC ........... 375/265; 375/245; 375/264; 375/279; 375/280; 370/468

(58) Field of Classification Search
USPC ........................................................ 375/265
See application file for complete search history.

(56) References Cited

U.S. PATENT DOCUMENTS 4,047,151 A 9/1977 Rydbeck
4,277,778 A * 7/1981 Persson .......................... 375/272

(Continued)

FOREIGN PATENT DOCUMENTS

CA 2300852 3/1999
CN 1278379 12/2000

(Continued)

OTHER PUBLICATIONS

International Preliminary Examination Report of Aug. 31, 2006 for PCT/JP2004/018536.

(Continued)

*Primary Examiner* — Lihong Yu
(74) *Attorney, Agent, or Firm* — Eric J. Robinson; Robinson Intellectual Property Law Office, P.C.

(57) ABSTRACT

There are provided a transmission and reception device having a function for correcting a data error in a communication path. In the transmission device, a redundant bit addition unit adds a redundant bit to each data bit which has been divided by one bit by a division unit; and an interleaver performs interleave. The transmission device transmits a signal which has been subjected to FM modulation by an FM modulation unit. In the reception device, a symbol decision unit performs a symbol decision at a Nyquist point for a signal which has been FM-demodulated by an FM demodulation unit; a bit conversion unit performs bit conversion according to the result of symbol decision; and a frame recovery unit deletes the redundant bit added by the redundant bit addition unit of the transmission device, from the bit string de-interleaved by a de-interleaver. Thus, it is possible to surely perform an error correction with a simple configuration even when the communication state is not in a preferable environment.

6 Claims, 8 Drawing Sheets

U.S. PATENT DOCUMENTS

| | | | |
|---|---|---|---|
| 4,534,040 A | | 8/1985 | Thapar |
| 4,616,702 A | | 10/1986 | Hanson et al. |
| 4,888,799 A | | 12/1989 | Mobley |
| 4,897,857 A | | 1/1990 | Wakatsuki et al. |
| 4,901,072 A | * | 2/1990 | Fox .................................. 341/10 |
| 4,984,191 A | * | 1/1991 | Vermesse ...................... 705/410 |
| 5,214,656 A | * | 5/1993 | Chung et al. .................. 714/758 |
| 5,457,705 A | * | 10/1995 | Todoroki ...................... 714/795 |
| 5,473,612 A | * | 12/1995 | Dehner et al. ................. 370/514 |
| 5,566,213 A | * | 10/1996 | Carsello ......................... 375/344 |
| 5,677,681 A | * | 10/1997 | Tanaka et al. ............. 340/825.21 |
| 5,818,875 A | * | 10/1998 | Suzuki et al. .................. 375/261 |
| 5,828,672 A | * | 10/1998 | Labonte et al. ............... 714/708 |
| 5,835,508 A | | 11/1998 | Kushita |
| 5,881,071 A | * | 3/1999 | Kuznetsov et al. ............ 714/752 |
| 6,125,148 A | | 9/2000 | Frodigh et al. |
| 6,232,906 B1 | | 5/2001 | Tada |
| 6,249,212 B1 | * | 6/2001 | Beigel et al. ................ 340/10.34 |
| 6,311,306 B1 | * | 10/2001 | White et al. ................... 714/790 |
| 6,512,748 B1 | | 1/2003 | Mizuki et al. |
| 6,934,317 B1 | | 8/2005 | Dent |
| 2002/0040460 A1 | | 4/2002 | Choi et al. |
| 2003/0039229 A1 | | 2/2003 | Ostman |
| 2003/0167425 A1 | | 9/2003 | Bader et al. |
| 2003/0206602 A1 | | 11/2003 | Yamamoto |
| 2005/0047323 A1 | | 3/2005 | Clarkson et al. |
| 2005/0243941 A1 | | 11/2005 | Anim-Appiah et al. |
| 2007/0160163 A1 | | 7/2007 | Majima |
| 2009/0193309 A1 | | 7/2009 | Majima |
| 2009/0202065 A1 | | 8/2009 | Majima |
| 2009/0202066 A1 | | 8/2009 | Majima |

FOREIGN PATENT DOCUMENTS

| | | |
|---|---|---|
| EP | 0 727 891 | 8/1996 |
| EP | 1 388 965 | 2/2004 |
| EP | 1 732 258 | 12/2006 |
| JP | 63-172535 | 7/1988 |
| JP | 63-174445 | 7/1988 |
| JP | 07-015353 | 1/1995 |
| JP | 11-220762 | 8/1999 |
| JP | 2001-515301 | 9/2001 |
| JP | 2003-143243 | 5/2003 |
| JP | 2003-158502 | 5/2003 |
| JP | 2003-174485 | 6/2003 |
| JP | 2003-338852 | 11/2003 |
| JP | 2004/200972 | 7/2004 |
| WO | WO 97/33402 | 9/1997 |
| WO | WO 99/12283 | 3/1999 |
| WO | WO 01/26236 | 4/2001 |
| WO | WO 02/069546 | 9/2002 |
| WO | WO 03/049392 | 6/2003 |
| WO | WO 03/063465 | 7/2003 |

OTHER PUBLICATIONS

Office Action (Application No. 2003-409688) Dated Jul. 3, 2008.
International Search Report for PCT/JP2004/018536.
Supplementary European Search Report (Application No. 04801682.8) dated Dec. 16, 2008.
Notification of Reason for Refusal (Application No. 2008-230306) dated Jul. 19, 2011.
Office Action (U.S. Appl. No. 12/420,313) dated Oct. 4, 2011.
Office Action (U.S. Appl. No. 12/420,559) dated Nov. 10, 2011.
Office Action (U.S. Appl. No. 12/420,313) dated Apr. 24, 2012.
Office Action (U.S. Appl. No. 12/419,559) dated Oct. 31, 2012.
Notice of Allowance (U.S. Appl. No. 12/420,313) dated Nov. 8, 2012.
Notice of Allowance (U.S. Appl. No. 11/663,552) dated Nov. 19, 2012.
Office Action (U.S. Appl. No. 11/663,552) dated Dec. 16, 2009.
Office Action (U.S. Appl. No. 11/663,552) dated Jun. 10, 2010.
Office Action (U.S. Appl. No. 11/663,552) dated Oct. 20, 2010.
Office Action (U.S. Appl. No. 11/663,552) dated Feb. 28, 2011.
International Search Report (PCT/JP2004/019721) dated Mar. 1, 2005.
Notification of Transmittal of Translation of the International Preliminary Report on Patentability (PCT/JP2004/019721) dated Aug. 31, 2006.
Supplementary European Search Report (Application No. 04808071.7) dated Jan. 30, 2008.
Written Notification of Reason for Refusal (JP 2003-435638) dated Apr. 1, 2008.
Morimoto, et al., "A Study on a Hierarchical Image Transmission System in a Rayleigh Fading Channel," Department of Communications Engineering, Faculty of Engineering, Osaka University Institute of Electronics, Information Communication Engineers (IEICE), vol. 96, No. 49, May 21, 1996, pp. 33-38.
Office Action (U.S. Appl. No. 10/582,615) dated Mar. 18, 2009.
Office Action (U.S. Appl. No. 10/582,615) dated Sep. 22, 2009.
Office Action (U.S. Appl. No. 10/582,615) dated Jan. 14, 2010.
Office Action (U.S. Appl. No. 10/582,615) dated Feb. 17, 2010.
Office Action (U.S. Appl. No. 10/582,615) dated Sep. 7, 2010.
Office Action (U.S. Appl. No. 12/420,313) dated Jul. 30, 2010.
Office Action (U.S. Appl. No. 12/420,313) dated Dec. 2, 2010.
European Search Report (Application No. 09005333.1) dated Jun. 19, 2009.
Office Action (U.S. Appl. No. 12/419,559) dated Mar. 12, 2010.
Office Action (U.S. Appl. No. 12/419,559) dated Sep. 14, 2010.
Office Action (U.S. Appl. No. 12/419,559) dated Mar. 18, 2011.
International Search Report (Application No. PCT/JP 2005/018492) dated Jan. 24, 2006.
Notification of Translation of Translation of International Preliminary Report on Patentability (Application No. PCT/JP 2005/018492) dated Jun. 28, 2007.
Office Action (JP 2004-287157) dated Apr. 6, 2010.
JP 05-284147 Machine Translation.
Harris, et al., "The ABCs of Linear Block Codes," IEEE Signal Processing Magazine, Jul. 2004, pp. 14-35.
Parker, "Computer Crime: Criminal Justice Resource Manual," U.S. Department of Justice, Office of Justice Programs, Aug. 1989, pp. 1-223.
Notice of Allowance (U.S. Appl. No. 12/419,559) dated Apr. 24, 2013.
Shibata JP 05-284147 Machine Translation (1993).

* cited by examiner

DEVICE AND METHOD FOR CORRECTING A DATA ERROR IN COMMUNICATION PATH

TECHNICAL FIELD

The present invention relates to a transmission device, a reception device, a data transmission method and a data reception method for functioning to correct a data error in a communication path.

BACKGROUND ART

Conventionally, researches on techniques for correcting the data error in the communication path have been advanced in various quarters. Some techniques have capabilities close to the Shannon limit.

Particularly, in a mobile communication, since an error characteristic in the communication path changes significantly, a very strong error correction is required.

As to the error correction techniques, retransmission techniques such as ARQ (Automatic Repeat Request) and the like, and FEC (Forward Error Correction) techniques are known. The ARQ techniques are that for performing the error correction by requesting a transmitter to retransmit data which had an error after being received (hence the techniques are classified into backward). The FEC techniques are that for previously devising the data to be transmitted and received so as to transmit reliable data and remove the error at a receiver (hence the techniques are forward). It should be noted that it is common to use the FEC and the ARQ simultaneously in a data communication, and to use the FEC only when a simultaneous processing on sounds and images is required.

However, in a transmission and reception device using the ARQ and the like, the more retransmissions are increased, the more a transmission efficiency is decreased. Moreover, in the transmission and reception device using the ARQ and the like, it is difficult to transmit and receive voice data or image data transmitted through a telephone call or streaming, due to necessity of the simultaneous processing.

For this reason, with respect to the data communication for e-mails and the like, and the transmission of the voice data or the image data, a transmission and reception device using the FEC techniques and the like has been proposed for restoring the received data as far as possible without retransmitting the data by performing the error correction for the received data, as described in Japanese Patent Laid-Open No. 2002-3444413 (pages 6 to 8, FIG. 1). This transmission and reception device performs the error correction using block codes or convolution codes.

However, in the transmission and reception device using the conventional FEC techniques, computation of the error correction is so complex that computation processes are increased. For this reason, in such a transmission and reception device, a significant memory capacity is also required for the computation.

Moreover, the transmission and reception device of a FEC method causes a disadvantage in which on the contrary more errors are occurred when the data errors increase in the communication path beyond a processing capacity for the error correction.

Particularly, in the communication such as a sound call, such a disadvantage is not preferable. Since the sound has many factors to be captured in a human sense, it is more important to be able to recognize which words are spoken in the sound even including some noises. In other words, if the FEC causes many more errors, data interpolation, repeat or discard (missing) and the like are performed. This process is referred to as Bad Frame Masking process. When this Bad Frame Masking process occurs frequently, the contents itself of the call would be likely to be inaudible.

DISCLOSURE OF THE INVENTION

The present invention has been made in view of these conventional issues, and an object of the present invention is to provide a technical method capable of surely performing an error correction, and a transmission device, a reception device, a data transmission method and a data reception method employing the technical method.

To achieve the above described inventive object, a transmission device according to the first viewpoint of the present invention basically consists of a redundant bit addition unit for adding redundant bit data to each bit of provided data to generate coded data, and a modulation unit for sending a modulated wave signal which has been generated based on the coded data generated by the above described redundant bit addition unit.

In the transmission device of the present invention, the above described redundant bit addition unit preferably arranges symbols added with the above described redundant bit data such that a Euclidean distance of the data added with the redundant bit data becomes large, or adds the redundant bit data to each bit of the above described provided data such that a Gray code is generated.

Moreover, the data provided to the above described redundant bit addition unit is data in which high and low of significance levels thereof are predetermined, and the above described redundant bit addition unit may add the redundant bit for the bit data having the high significance level of bit-arranged data.

Furthermore, the above described modulation unit may perform modulation according to a multivalued FSK method.

A reception device according to the second viewpoint of the present invention operates to receive a signal which has been generated based on data added with redundant bit data such that coded data is generated, and basically consists of a demodulation unit for demodulating the above described received signal; a symbol decision unit for performing a symbol decision at each Nyquist interval for the signal which has been demodulated by the above described demodulation unit; a bit conversion unit for converting a symbol value, which has been provided by performing the symbol decision by the above described symbol decision unit, into a bit value; and a data recovery unit for composing a data string by deleting the added redundant bit from the data of the bit value, which has been converted by the above described bit conversion unit, to restore original data.

In the reception device of the present invention, the above described received signal is preferably a signal which has been modulated according to the multivalued FSK method, the above described demodulation unit demodulates the received signal by converting the received signal into a signal of a voltage corresponding to a frequency of the above described received signal, and the above described symbol decision unit performs the symbol decision by comparing the voltage of the signal, which has been demodulated by the above described demodulation unit, with preset threshold values.

Moreover, the bit data which has been generated by the above described bit conversion unit is data in which bits are arranged such that high and low of significance levels thereof are predetermined and the bit data having the high significance level is added with the redundant bit. The above described data recovery unit may delete the redundant bit added to the above described bit data having the high significance level.

A data transmission method according to the third viewpoint of the present invention basically includes the steps of: adding a redundant bit to each bit of provided data to generate coded data; and sending a signal which has been generated based on the above described generated coded data.

A data reception method according to the fourth viewpoint of the present invention basically includes the steps of: receiving a signal which has been generated based on data added with redundant bit data such that coded data is generated; demodulating the received signal; performing a symbol decision at each Nyquist interval for the signal which has been demodulated; converting a symbol value provided as a result of the symbol decision into a bit value; and composing a data string by deleting the added redundant bit from the data of the above described bit value which has been converted, to restore original data.

BEST MODE FOR CARRYING OUT THE INVENTION

A transmission and reception device according to an embodiment of the present invention will be described with reference to the drawings.

Figure 1:
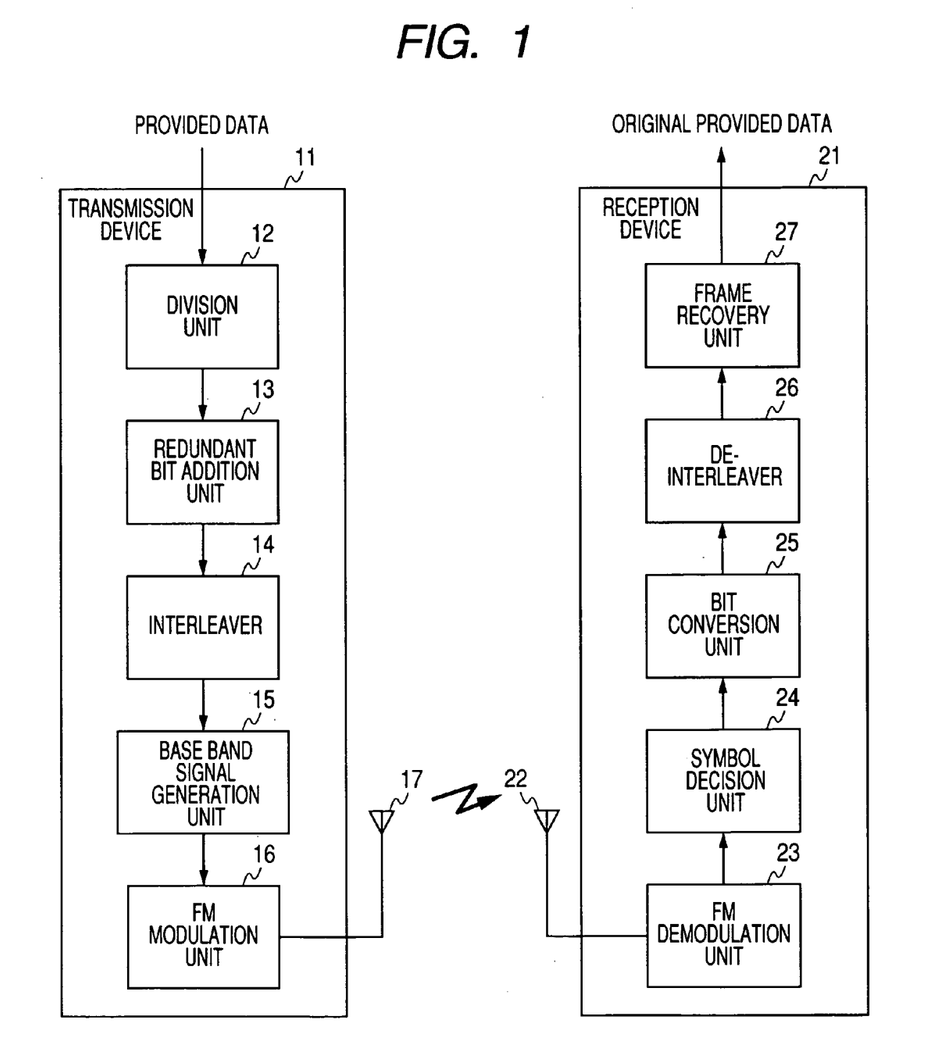
FIG. 1 is a block diagram showing a configuration of a transmission and reception device according to an embodiment of the present invention.

FIG. 1 shows a configuration of the transmission and reception device according to this embodiment.

The transmission and reception device according to this embodiment consists of a transmission device 11 and a reception device 21.

The transmission device 11 for transmitting a signal, which has been modulated according to a provided data, is provided with a division unit 12, a redundant bit addition unit 13, an interleaver 14, a base band signal generation unit 15, a FM modulation unit 16 and a transmission antenna 17.

In this embodiment, by way of example, the case will be described where a voice vocoder is transmitted according to a 4-value root Nyquist FSK method.

The voice vocoder is a system for representing a sound signal in a digital format, in which a set of parameters of the sound is analyzed and extracted to recompose the sound from the parameters.

Figure 2:
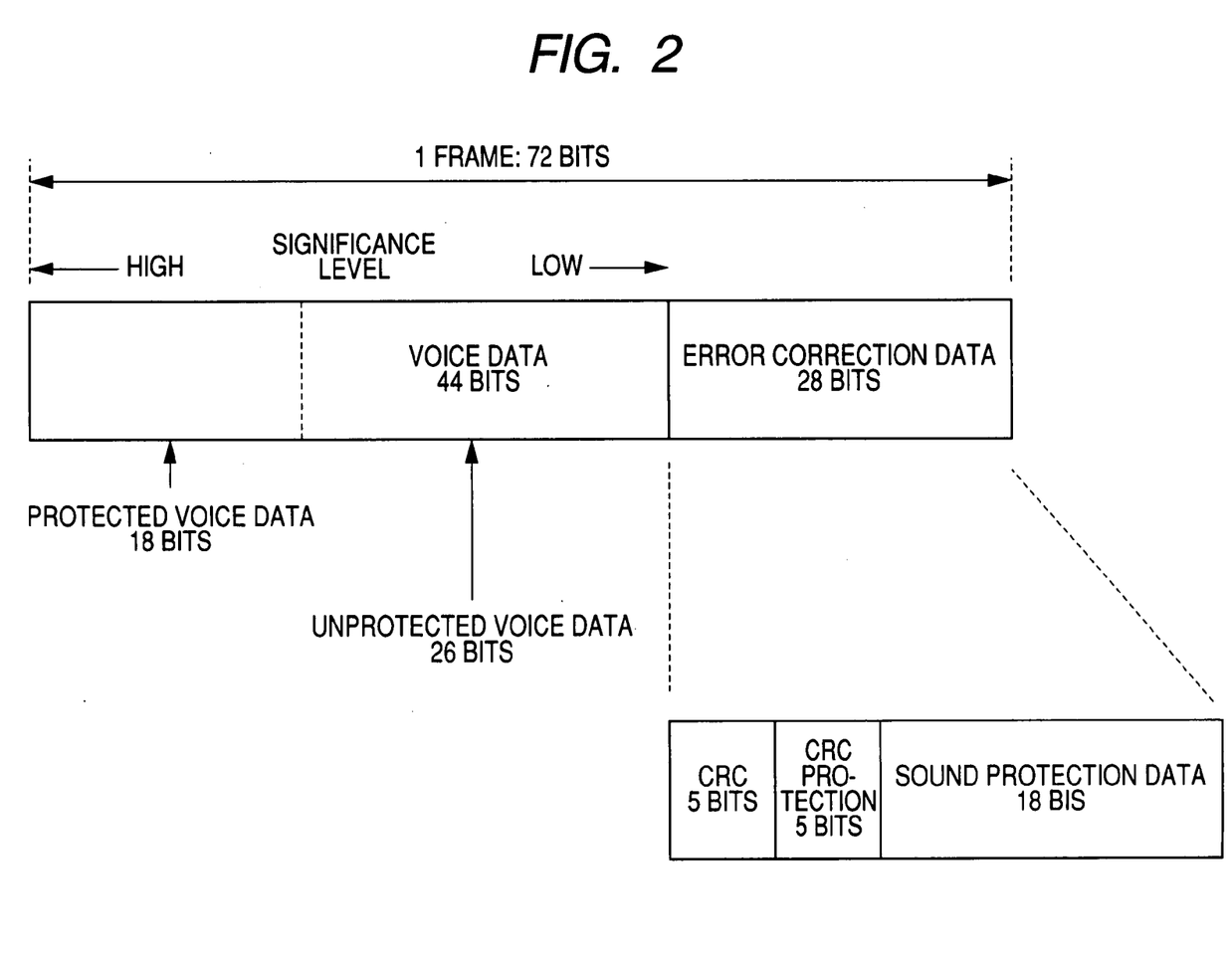
FIG. 2 is an illustration showing a configuration of a data frame of a voice vocoder.

Data of the voice vocoder is framed and processed in which information is delimited in temporal units, as shown in FIG. 2.

The data of the voice vocoder is framed in units of 20 msec. A data frame of the voice vocoder consists of voice data and error correction data, and the number of bits in one frame is to be 72 bits (3600 bps). The voice data is data describing sound information, and the error correction data is data for correcting an error and detecting the error in the voice data.

The error correction data consists of 5 bits of CRC data, 5 bits of CRC protection data and 18 bits of sound protection data.

The number of bits of the voice data is to be 44 bits in one frame, and the number of bits of the error correction data is to be 28 bits.

Each bit data of the voice data has been sorted in a descending order of a significance level for the auditory sense of human. The voice data is configured with 18 bits of protected voice data and 26 bits of unprotected voice data.

The protected voice data is data of a high significance level to be protected even when a communication state is not in a preferable environment such that many errors are likely to occur. For example, in a communication such as a sound call, since the sound has many factors to be captured in a human sense, it is important to be able to recognize which words are spoken in the sound even superimposed with noises.

In the case of the transmission of the sound or image, if the error has occurred in a high significant bit, the bit is captured in the human sense as a noise irrelevant to the information. In the voice vocoder, such significant data for configuring the sound is treated as the protected voice data.

Figure 3:
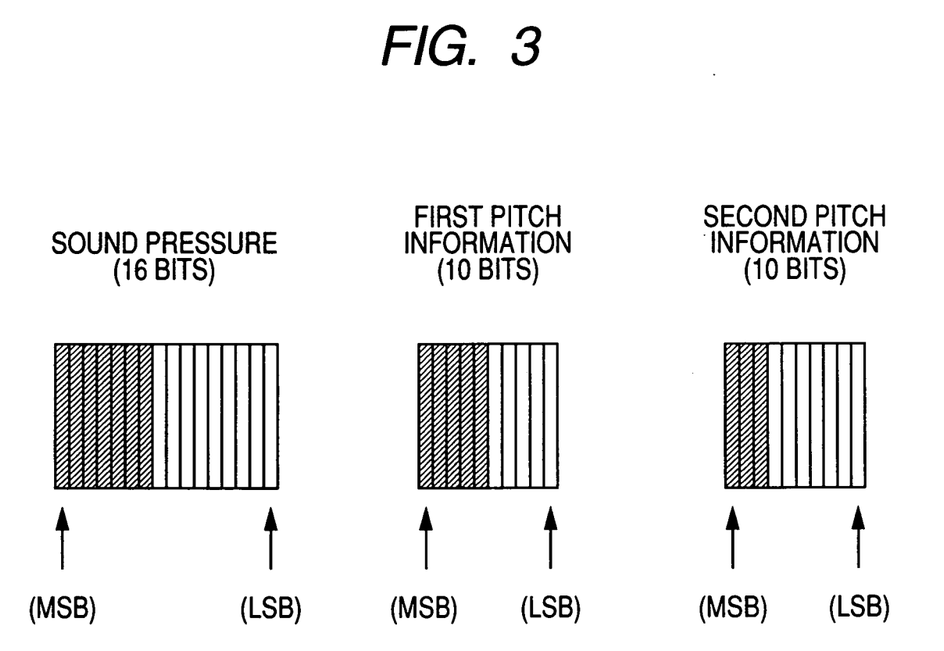
FIG. 3 is an illustration showing significance levels of data frames.

For example, in the case of the sound, there are sound pressure data, pitch frequency data and the like in the vocoder data. It is assumed that the data of the vocoder data consists of 16 bits of the sound pressure data, 10 bits of first pitch information and 10 bits of second pitch information, as shown in FIG. 3. The FIG. 3 shows that the leftmost bit is a most significant bit (MSB) and the rightmost bit is a least significant bit (LSB) in respective data. In the example shown in FIG. 3, it is assumed that these bits of the data have been arranged according to the significance level in which shaded bits are high significant bits and the most significant bit has the highest significance level. It should be noted that the bits considered to have the high significance level may be previously determined by verifying or simulating an algorithm of the vocoder and the like.

As the bit becomes higher, the effect on the information by the error in the bit becomes more significant. For example, in data of "FFFF", when the error occurs in the most significant bit, the data becomes "7FFF", resulting in a difference of 32768 in decimal number. However, when the error occurs in the least significant bit, only a difference of 1 occurs.

It is also similar with the image data. For example, yellow is generated by synthesizing red and green. When the error occurs in the most significant bit, the color is changed.

Thus, it is important how to protect the bit data of the high significance level. This embodiment protects such bit data of the high significance level with a simple configuration.

Back to FIG. 1, the division unit 12 is provided with the data of the voice vocoder as shown in FIG. 2, and divides the provided data by one bit. As described above, it should be noted that the bits considered to have the high significance level may be previously determined by verifying or simulating the algorithm of the vocoder and the like, and that the bits of the voice vocoder data have been arranged in the descending order of the significance level.

The redundant bit addition unit 13 adds a bit of "1" to the bit of the high significance level among respective bit data which have been divided by the division unit 12, and generates 2 bit data.

The interleaver 14 interchanges between the bits of the protected voice data and the bits of the unprotected voice data in units of the 2 bit data, which has been generated by the redundant bit addition unit 13, to distribute the arrangement of the significant bits or the CRC on the frame, and generates a data string for mitigating block errors due to phasing and the like.

The base band signal generation unit 15 generates a base band signal based on the data string which has been interchanged by the interleaver 14.

Figure 4:
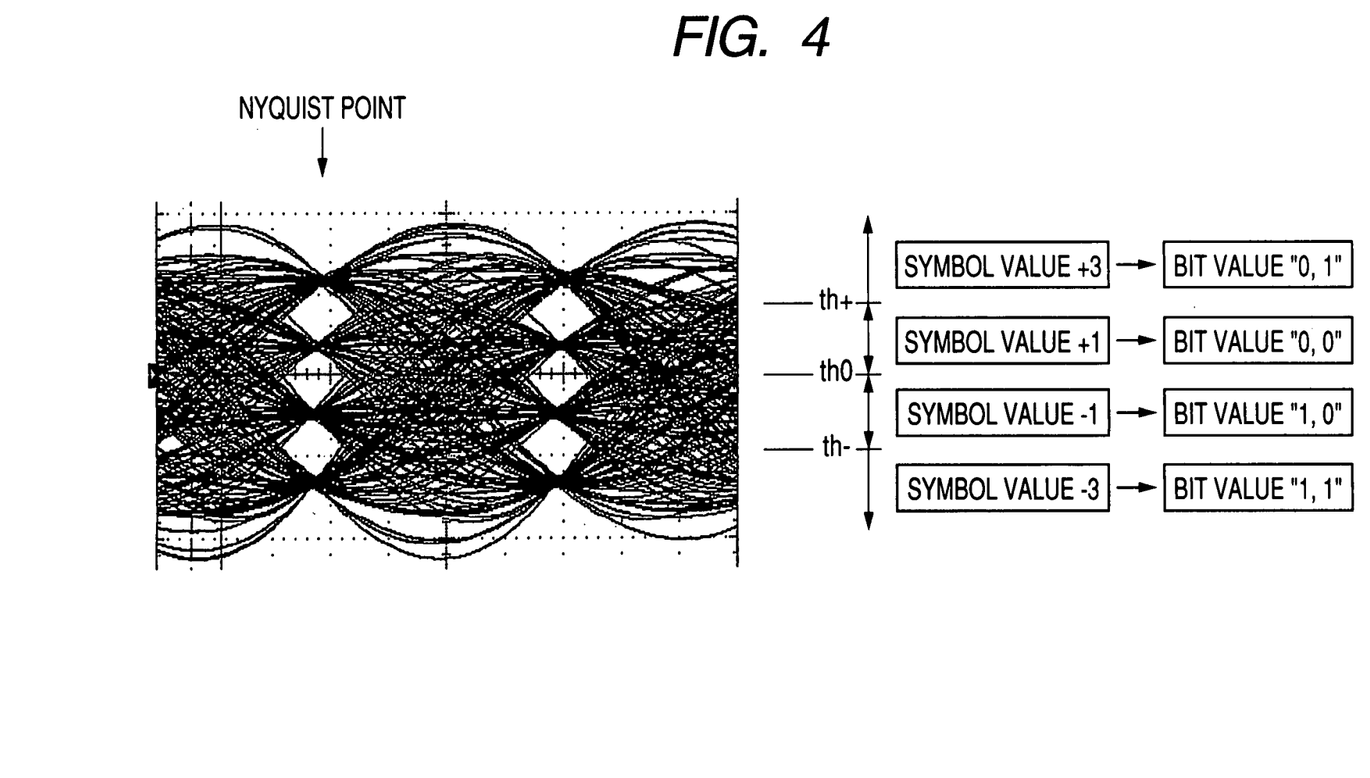
FIG. 4 is an illustration showing the contents of an eye pattern and a symbol decision in the case of using a 4-value Nyquist FSK.

The FM modulation unit 16 modulates a carrier wave according to the 4-value root Nyquist FSK method, with the base band signal which has been generated by the base band signal generation unit 15. The FM modulation unit 16 is provided with a root cosine filter, and generates such a signal in which an eye pattern is formed as shown in FIG. 4, with the base band signal which has been generated by the base band signal generation unit 15. The transmission antenna 17 sends the signal, which has been FM-modulated by the FM modulation unit 16, as a radio wave.

The reception device 21 is provided with a reception antenna 22, a FM demodulation unit 23, a symbol decision unit 24, a bit conversion unit 25, a de-interleaver 26 and a frame recovery unit 27.

The reception antenna 22 receives the radio wave sent from the transmission device 11, and converts the radio wave into a signal of the FSK method.

The FM demodulation unit 23 performs a FM-demodulation by converting the signal of the FSK method which has been converted by the reception antenna 22, into a voltage signal of a voltage based on its frequency, and generates a detection signal.

The symbol decision unit 24 performs a symbol decision at a Nyquist point of the detection signal which has been generated by the FM demodulation unit 23. With the detection signal of the FM demodulation unit 23, the eye pattern is drawn as shown in FIG. 4. According to the 4-value FSK method, up to three opening portions are observed in this eye pattern.

This point is set as the Nyquist point, and three threshold values th+, th0 and th− are preset for performing the symbol decision. The symbol decision unit 24 performs the symbol decision by comparing these three threshold values th+, th0 and th−, with the voltage of the detection signal, at the Nyquist point.

When the voltage of the detection signal at the Nyquist point exceeds the threshold value th+, the symbol decision unit 24 judges that a symbol value is +3. When the voltage of the detection signal at the Nyquist point is equal to or greater than the threshold value th0 and equal to or less than the threshold value th+, the symbol decision unit 24 judges that the symbol value is +1. When the voltage of the detection signal at the Nyquist point is less than the threshold value th0 and equal to or greater than the threshold value th−, the symbol decision unit 24 judges that the symbol value is −1. When the voltage of the detection signal at the Nyquist point is less than the threshold value th−, the symbol decision unit 24 judges that the symbol value is −3.

The bit conversion unit 25 converts the symbol value, which has been judged by the symbol decision unit 24, into bits of a bit value based on the symbol value. As shown in FIG. 4, if the symbol value, which has been judged by the symbol decision unit 24, is +3, the bit conversion unit 25 converts the symbol value +3 into the bit value "0,1". If the symbol value is +1, the bit conversion unit 25 converts the symbol value +1 into the bit value "0,0". If the symbol value is −1, the bit conversion unit 25 converts the symbol value −1 into the bit value "1,0". If the symbol value is −3, the bit conversion unit 25 converts the symbol value −3 into the bit value "1,1". It should be noted that the arrangement of the bits, which have been bit-converted by the bit conversion unit 25, has become a Gray code.

The de-interleaver 26 reinterchanges the data, which has been bit-converted by the bit conversion unit 25, in units of 2 bits.

The frame recovery unit 27 deletes the redundant bit from the data which has been reinterchanged by the de-interleaver 26, and generates the original data frame.

Next, operations of the transmission and reception device according to an embodiment will be described below.

Figure 5:
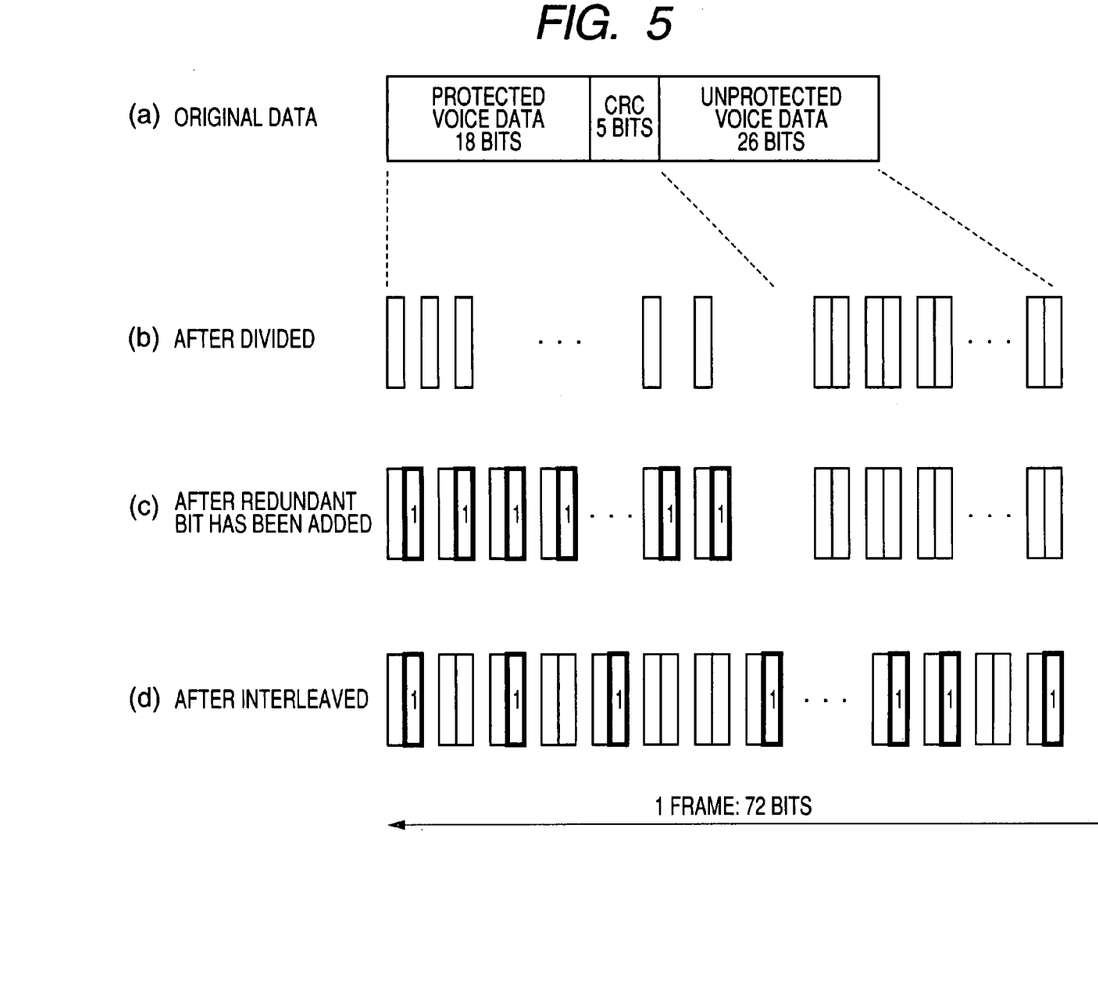
FIG. 5 is an illustration showing operations of the transmission device shown in FIG. 1.

The division unit 12 of the transmission device 11 divides the protected voice data including the CRC 5 bits in the voice vocoder data provided as shown in FIG. 5 at (a), by one bit, and generates the bit data each having one bit as shown in FIG. 5 at (b). Moreover, the division unit 12 divides the unprotected voice data by two bits.

The redundant bit addition unit 13, as shown in FIG. 5 at (c), adds the bit of "1" to each bit data which has been divided from the protected voice data, including the CRC 5 bits, and generates the 2 bit data.

As shown in FIG. 5 at (c), by adding the redundant bit "1" to each bit data of the protected voice data by the redundant bit addition unit 13, the bit data of the protected voice data certainly would correspond to the symbol value +3 or −3. In other words, an interval between the symbol value +3 and the symbol value −3 becomes large, thereby a gain at the Nyquist point becomes large.

The interleaver 14 interchanges between a pair of the bit added with the redundant bit and the bit of the protected voice data, and 2 bits of the unprotected voice data, in units of 2 bits of the data which has been generated by the redundant bit addition unit 13, and generates the data string as shown in FIG. 5 at (d).

The base band signal generation unit 15 generates the base band signal based on the data string which has been interchanged by the interleaver 14.

The FM modulation unit 16 modulates the carrier wave according to the 4-value root Nyquist FSK method, with the base band signal which has been generated by the base band signal generation unit 15. The transmission antenna 17 sends the signal which has been FM-modulated by the FM modulation unit 16, as the radio wave.

The reception antenna 22 of the reception device 21 receives the radio wave sent from the transmission device 11, and converts the radio wave into the signal of the FSK method. The FM demodulation unit 23 converts the FSK signal which has been converted by the reception antenna 22, into the voltage signal of the voltage based on its frequency, and generates the detection signal.

The symbol decision unit 24 performs the symbol decision by comparing the voltage at the Nyquist point of the detection signal which has been generated by the FM demodulation unit 23, with the preset three threshold values th+, th0 and th−.

The bit conversion unit 25 converts the symbol, which has been judged by the symbol decision unit 24, into the bits of the bit value based on the symbol value.

Figure 6:
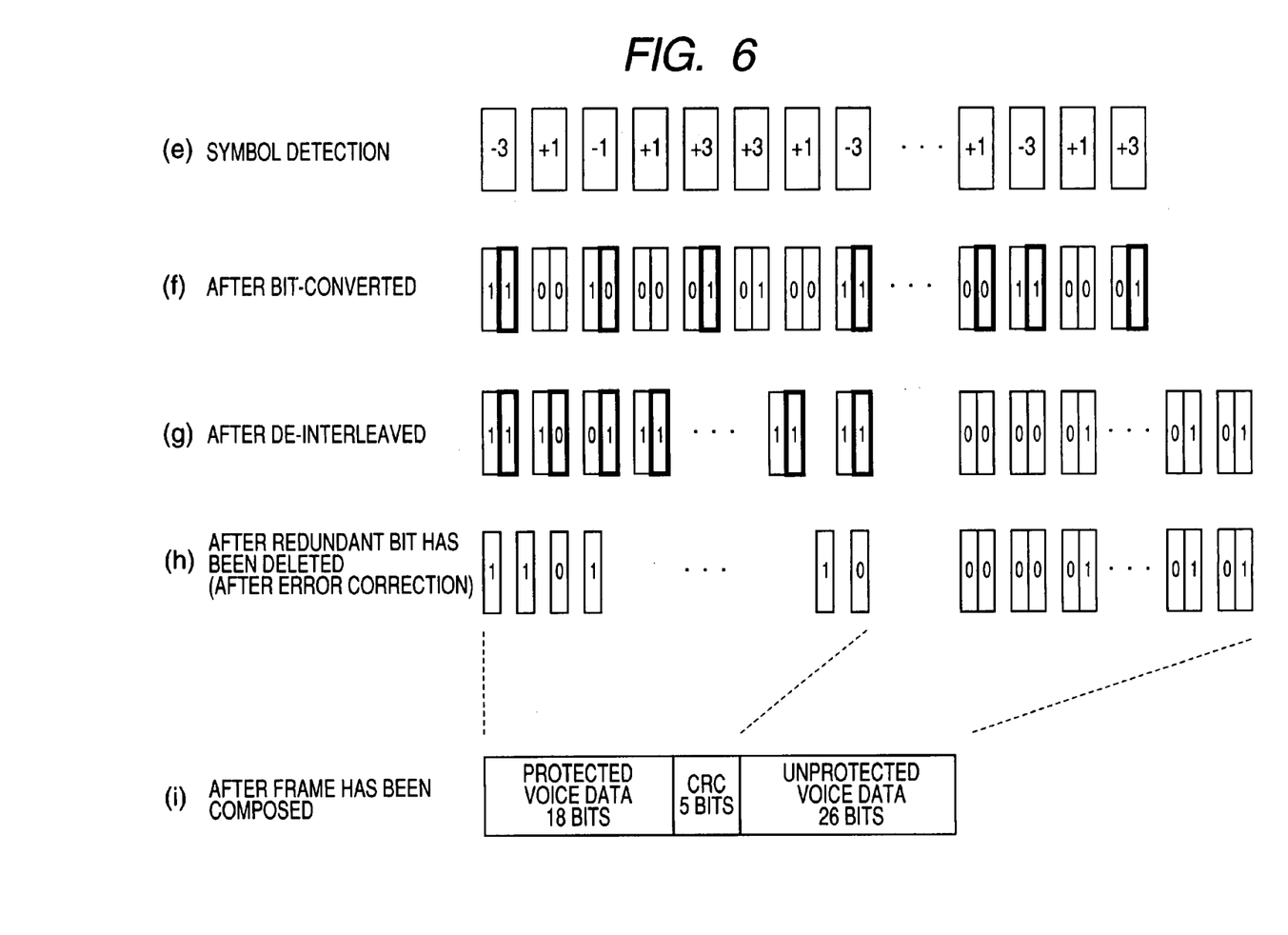
FIG. 6 is an illustration showing operations of the reception device shown in FIG. 1.

As shown in FIG. 6 at (e), if the symbol value as a result of the decision by the symbol decision unit 24 is −3, the bit conversion unit 25 converts the symbol value into the bit value "1,1", as shown in FIG. 6 at (f). Similarly, the bit conversion unit 25 performs the bit conversion according to the symbol decision value. It should be noted that the bit arrangement of the bit-converted data has become the arrangement of the Gray code.

As shown in FIG. 6 at (g), the de-interleaver 26 reinterchanges the data, which has been bit-converted by the bit conversion unit 25, such that the data becomes in the data arrangement of pairs of the bit added with the redundant bit and the bit of the protected voice data, and the 2 bits of the unprotected voice data.

The frame recovery unit 27 deletes the redundant bit added to the protected voice data, from the data which has been reinterchanged by the de-interleaver 26, as shown in FIG. 6 at (h), and composes the respective bits to generates the original data frame as shown in FIG. 6 at (i).

When focusing attention only on the protected bit data, as a result, the transmission device 11 has performed a 2-valued modulation instead of a 4-valued modulation. Moreover, the reception device 21 only deletes lower bits, and as a result, the process performed by the reception device 21 would be equivalent to performing the demodulation of the two values.

Therefore, though each symbol interval is "2" in the case of 4 values, the symbol interval would be "6" which is three times as many as 2, and in theory, BER would be improved by approximately 4.8 dB, according to such configuration of this embodiment.

Thus the transmission device 11 adds the redundant bit according to the 4-value FSK method, and the reception device 21 deletes the redundant bit which has been added by the transmission device 11. As a result, though it has been equivalent to a 2-value FSK method in terms of characteristics, the modulation method remains to be the 4-value FSK method.

Figure 7:
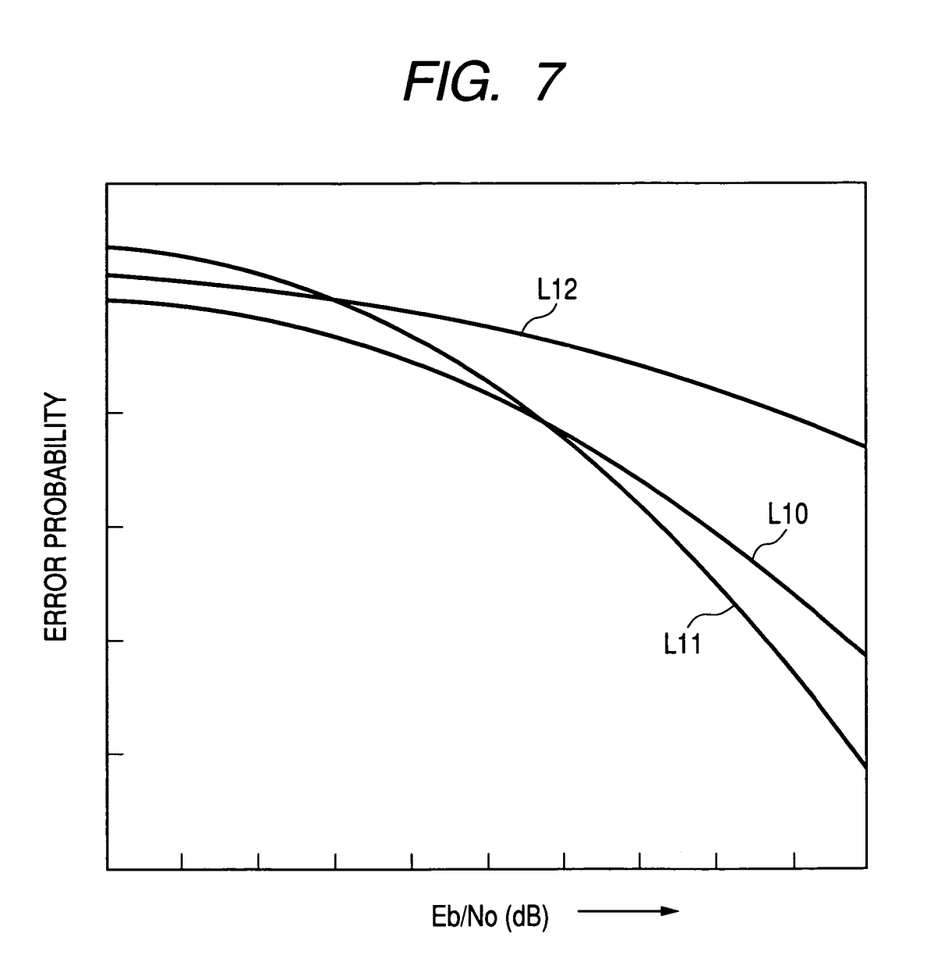
FIG. 7 is an illustration showing an error characteristic in the transmission and reception device shown in FIG. 1.

BER curves in the case of focusing attention only on the protected bits are shown in FIG. 7.

In FIG. 7, a characteristic curve L10 represents a characteristic by the transmission and reception device according to this embodiment. A characteristic curve L11 represents the characteristic in the case where decoding has been performed by a Viterbi decoder having an encoding ratio of 1/2. A characteristic curve L12 represents the characteristic in the case where the error correction is not performed. Moreover, the right edge of a graph represents the case where the communication state is most preferable, and the graph represents that the communication state degrades as the value of Eb/No changes toward the left side.

As shown in this FIG. 7, if the communication state is preferable, as shown with the characteristic curve L11, the effect of the error correction by decoding with the Viterbi decoder is larger, and the BER is low. However, as the communication state degrades, the effect of the error correction by decoding with the transmission and reception device according to this embodiment would be larger in the effect of its error correction capability, than the case of decoding with the Viterbi decoder.

Figure 8:
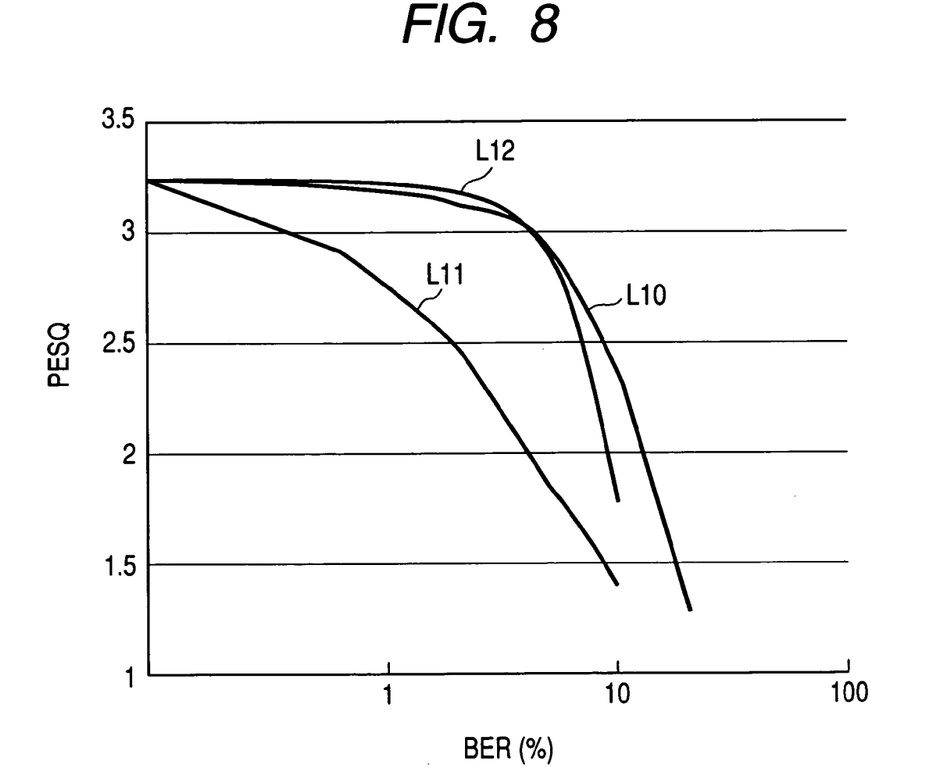
FIG. 8 is an illustration showing a relationship between BER and PESQ in the transmission and reception device shown in FIG. 1.

Moreover, sound quality characteristics are shown in FIG. 8, in the case where the transmission and reception device according to this embodiment is applied to an actual vocoder.

For evaluation of a sound quality, PESQ (Perceptual evaluation of speech quality) is used which is recommended by the ITU-T. It should be noted that in FIG. 8, L10, L11 and L12 represent the characteristic by the transmission and reception device according to this embodiment, the characteristic by the Viterbi decoder, and the characteristic in the case where the error correction is not performed, respectively, similarly to FIG. 7.

As shown in FIG. 8, if the BER is low, in other words, if the communication state is preferable, the sound quality by decoding with the Viterbi decoder is more preferable than with the transmission and reception device according to this embodiment. However, this difference is slight, and it is not a discriminable difference when the sounds are actually heard and compared. If the BER is high, in other words, if the communication state is not preferable, the sound quality by decoding with the transmission and reception device according to this embodiment would be more preferable than with the Viterbi decoder, and the high sound quality may be realized.

As described above, according to this embodiment, the transmission device 11 adds the redundant bit to each data bit of the voice vocoder, and after interleaving, FM-modulates and transmits this signal. The reception device 21 performs the symbol decision after performing the FM-demodulation, performs a bit-conversion de-interleaving, and then deletes the redundant bit added by the transmission device.

Therefore, even when the communication state is not in the preferable environment, it is possible to more surely perform the error correction. Particularly, the transmission and reception device of this embodiment would be suitable for transmission of the sound or the image through a telephone call or streaming.

Moreover, the error correction is performed by performing a simple process, in which the transmission device 11 adds the redundant bit to the data and the reception device 21 deletes the redundant bit of the demodulated data. Therefore, compared to a FEC method in which many operations are performed, and using the Viterbi decoder and the like in which a significant memory capacity is required, it is possible to have the simple configuration, since neither the operations nor the memory capacity for the error correction is required. In addition, it is possible to realize to have a lower electrical power consumption, since it is not necessary to have a processor operate on high speed.

It should be noted that various forms may be conceived in implementing the present invention, and they are not limited to the above described embodiments.

For example, in the above described embodiments, the case has been described where the sound call is performed by using the 4-value root Nyquist FSK. However, the data to be processed is not limited to the voice data, and the data may be the image data. The FSK is not limited to 4-value, and it may be multivalued which is equal to or more than 4 values. In addition, not only the FSK, but also other modulation methods such as PSK and the like may be used.

Moreover, in the above described embodiments, the example such as the telephone call or the streaming has been described in which the bit significance level is defined. However, the present invention may also be well applied to the case where it is desired to raise the gain simply also in a protocol or an e-mail communication.

Moreover, this embodiment may be executed by means of software. In this case, the transmission device 11 and the reception device 21 are provided with processors for executing the software. Even if this embodiment is executed by means of software, since it is not necessary to perform such operations as with the FEC, programs become simple, and it is possible to reduce the memory capacity required for the programs.

In this embodiment, the voice vocoder has been described by way of example. However, this embodiment may be applied not only to the voice vocoder, but also to a data communication. In this case, portions of data desired to be protected strongly and other data may be applied to the protected data and the unprotected data in this embodiment respectively.

Moreover, in the data to be used in the data communication and the like, the number of bits may be changed each time the contents of the communication change. In addition, for example, as is the case where "FF" and "FE" are flags for denoting the transmission and the reception respectively, even the least significant bit may also have the same significance level as an upper bit. In such a case, this embodiment would become significantly effective, for example, if 3 bits of control flag is added to the end of the data to make only these 3 bits strong in the error and the significance level may be defined accordingly.

Moreover, in this embodiment, the redundant bit addition unit 13 has added the redundant bit data to each bit of the provided data such that the Gray code is generated. However, it is not limited to the above described embodiments, if the redundant bit addition unit 13 arranges symbols added with the redundant bit data such that a Euclidean distance of the data added with the redundant bit data becomes large.

Industrial Applicability

According to the present invention, it is possible to provide a transmission device and a reception device, which can perform an error correction more surely in spite of their simple configurations, even when a communication state in a transmission path is in a defective environment.

The invention claimed is:

1. A transmission device which modulates and transmits transmission data of which a level of importance has been previously determined, comprising:
   a division unit configured to divide (1) a high-importance data string by one bit to generate high-importance bit data each having one bit and (2) a low-importance data string into low-importance bit data each having two bits;
   a bit addition unit configured to add a fixed value of one bit to each one bit of the high-importance bit data, to generate two bit high-importance bit data; and
   a modulation unit configured to perform modulation for arranging the two bit high-importance bit data generated and the two bit low-importance bit data to respective symbols based on the two bit data,
   wherein the fixed value is bit data which is common to, in an arrangement of the symbols, two symbols having a largest Euclidean distance, and
   a symbol including the high-importance data string is arranged to one of two symbols, among the symbols, having the largest Euclidean distance by adding the bit data having the fixed value.

2. The transmission device according to claim 1, wherein the high-importance data string includes flag data.

3. The transmission device according to claim 1, wherein the high-importance data string includes bits for error check.

4. The transmission device according to claim 1, wherein the high-importance data string includes bits for error correction.

5. The transmission device according to claim 1, wherein the quantity of the high-importance data string is less than the quantity of the low-importance data string.

6. A transmission method of a transmission device which modulates and transmits transmission data of which a level of importance has been previously determined, comprising:
   dividing a high-importance data string by one bit to generate high-importance bit data each having one bit;
   dividing a low-importance data string into low-importance bit data each having two bits;
   adding a fixed value of one bit to each one bit of the high-importance bit data, to generate two bit high-importance bit data; and
   performing modulation for arranging the two bit high-importance bit data generated and the two bit low-importance bit data, to respective symbols based on the two bit data,
   wherein the fixed value is bit data which is common to, in an arrangement of the symbols, two symbols having a largest Euclidean distance, and
   a symbol including the high-importance data string is arranged to one of two symbols, among the respective symbols, having the largest Euclidean distance by adding the bit data having the fixed value.

* * * * *